(12) United States Patent
Kwon

(10) Patent No.: US 7,142,406 B2
(45) Date of Patent: Nov. 28, 2006

(54) ELECTROSTATIC CHUCK OF SEMICONDUCTOR FABRICATION EQUIPMENT AND METHOD FOR CHUCKING WAFER USING THE SAME

(75) Inventor: Young-Min Kwon, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 115 days.

(21) Appl. No.: 10/934,602

(22) Filed: Sep. 3, 2004

(65) Prior Publication Data

US 2005/0047057 A1    Mar. 3, 2005

(30) Foreign Application Priority Data

Sep. 3, 2003    (KR) .................. 10-2003-0061554

(51) Int. Cl.
*H02N 13/00*    (2006.01)

(52) U.S. Cl. ..................................... 361/234
(58) Field of Classification Search ................. 361/234
See application file for complete search history.

(56) References Cited

U.S. PATENT DOCUMENTS

| | | | |
|---|---|---|---|
| 4,864,461 A * | 9/1989 | Kasahara ................. 361/234 |
| 5,572,398 A | 11/1996 | Federlin et al. |
| 5,933,314 A | 8/1999 | Lambson et al. |
| 5,986,874 A * | 11/1999 | Ross et al. ................. 361/234 |
| 6,416,618 B1 * | 7/2002 | Tsuchihashi et al. ... 156/345.51 |
| 6,663,973 B1 * | 12/2003 | Lee et al. .................. 428/447 |
| 2003/0067734 A1 * | 4/2003 | Nakano ...................... 361/234 |

FOREIGN PATENT DOCUMENTS

| JP | 4-186863 | 3/1992 |
|---|---|---|
| JP | 2003-142569 | 5/2003 |

OTHER PUBLICATIONS

Mayumi Takahashi, Masatoshi Tsuneoka and Takashi Shimizu: Electrostatic Chuck and Chucking Method; Patent Abstracts of Japan; Publication Date: May 16, 2003; Publication No. 2003-142569; Applicant: Applied Materials Inc.; Japan Patent Office.
Yasushi Sakakibara and Yasutaka Harada; Electrostatic Attracting Equipment; Patent Abstracts of Japan; Publication Date: Jul. 3, 1992; Publication No. 04-186863; Applicant: Fuji Electric Co. Ltd; Japan Patent Office.

* cited by examiner

*Primary Examiner*—Ronald W. Leja
(74) *Attorney, Agent, or Firm*—Andrew D. Fortney

(57) ABSTRACT

The present invention relates to an electrostatic chuck having electrodes of which polarities are periodically inverted, and a method for chucking wafers using the electrostatic chuck. The electrostatic chuck of the present invention includes an electrode part including first and second electrodes having different polarities and generating electrostatic charge for fixing a wafer, an electric source part having a first electric source for supplying positive and negative electricity to the respective first and second electrodes and a second electric source for supplying the negative and positive electricity to the respective first and second electrodes, and a polarity inversion part for inverting the polarities of the first and second electrodes every cycle.

17 Claims, 2 Drawing Sheets

ELECTROSTATIC CHUCK OF SEMICONDUCTOR FABRICATION EQUIPMENT AND METHOD FOR CHUCKING WAFER USING THE SAME

CLAIM OF PRIORITY

This application makes reference to, incorporates the same herein, and claims all benefits accruing under 35 U.S.C. §119 from an application for ELECTROSTATIC CHUCK OF SEMICONDUCTOR FABRICATION EQUIPMENT AND METHOD FOR CHUCKING WAFER USING THE SAME filed in the Korean Industrial Property Office on Sep. 3, 2003 and there duly assigned Serial No. 10-2003-61554.

BACKGROUND OF THE INVENTION (a) Field of the Invention

The present invention relates to an electrostatic chuck of semiconductor fabrication equipment, and in particular, to a bipolar electrostatic chuck of which polarity is periodically alternated and a method for chucking wafers using the bipolar electrostatic chuck.

(b) Description of the Related Art

Typically, semiconductor devices are fabricated by repeatedly performing processes such as photolithography, etching, diffusion, ion implantation, metal deposition, chemical vapor deposition, etc. onto a wafer, and the wafers move between the processes in a carrier until being completed as semiconductor devices. The wafers carried in the carrier are moved to each process chamber by a transfer robot or an operator.

In order to fix the wafer at a working position, a mechanical means using vacuum pressure or an electrical means using electric characteristic is utilized. The electrostatic chucks are examples of the electrical means and have been disclosed in U.S. Pat. Nos. 5,572,398 and 5,933,314.

The electrostatic chuck can be classified into two types: a unipolar type and a bipolar type. The unipolar type electrostatic chuck is provided with a single electrode and forms an electric field by negative ions generated when the plasma stratum is formed so as to carry out chucking. Here, the wafer is isolated from the electrode by a dielectric material interposed between them.

In the meantime, the bipolar electrostatic chuck is provided with two electrodes isolated from each other and negative and positive voltages are supplied to the respective electrodes, resulting in chucking.

FIG. 1 is a schematic view illustrating a conventional bipolar type of electrostatic chuck.

As shown in FIG. 1, the electrostatic chuck includes an electrode part 110, a dielectric layer 120, and a power source 130 for supplying electric power to the electrode part 110. The electrode part 110 includes two electrodes 112 and 114 each having different pole so as to generate a static charge.

Not shown in the drawing, a lift that can move up and down can be installed so as to position the wafer at a predetermined height from the electrode part.

However, the conventional electrostatic chuck has a shortcoming in that the surface of the dielectric layer 120 of the electrostatic chuck is likely to be worn away due to abrasion while fixing the wafer (W) on the electrostatic chuck.

Also, since the conventional electrostatic chuck has a structure such that the positive and negative voltages are continuously applied to the respective positive and negative electrodes, the abrasion occurs differently according to the areas at which the electrodes are positioned as time passed, resulting in irregular abrasion distribution of the dielectric layer 120. Accordingly, the irregular abrasion causes a reduction of the life of the electrostatic chuck and the regularity of a thickness of a layer deposited during the high density plasma chemical vapor deposition (HDP CVD), making the electric charge unstable.

SUMMARY OF THE INVENTION

The present invention has been made in an effort to solve the above problems, and it is an object of the present invention to provide an electrostatic chuck of semiconductor fabrication equipment which is capable of prolonging its life by maintaining regular abrasion and avoiding layer thickness irregularities and plasma discharge instability.

Another object of the present invention is to provide a method for chucking the wafers using the above electrostatic chuck.

The object of the present invention is achieved with the electrostatic chuck of semiconductor fabrication equipment having a polarity inversion part for periodically inverting the polarities of the first and second electrodes of the electrode part.

According to a preferred embodiment of the present invention, the electrode part includes first and second electrode alternately arranged, and first and second conductive parts for respectively conducting to electrodes having identical polarities. The electric source part includes a first electric source for supplying positive and negative electricity to the respective first and second electrodes, and a second electric source for supplying the negative and positive electricity to the respective first and second electrodes, and the polarity inversion part includes a switching circuit that periodically switches between the first and second electric sources.

Accordingly, when the wafer is chucked by the above structured electrostatic chuck, the polarities of the first and second electrodes are inverted by the switching circuit of the polarity inversion part when 1, 2, or 3 wafers have been processed.

DETAILED DESCRIPTION OF THE PREFERRED EMBODIMENTS

Preferred embodiments of the present invention will be described hereinafter with reference to the accompanying drawings.

Figure 1:
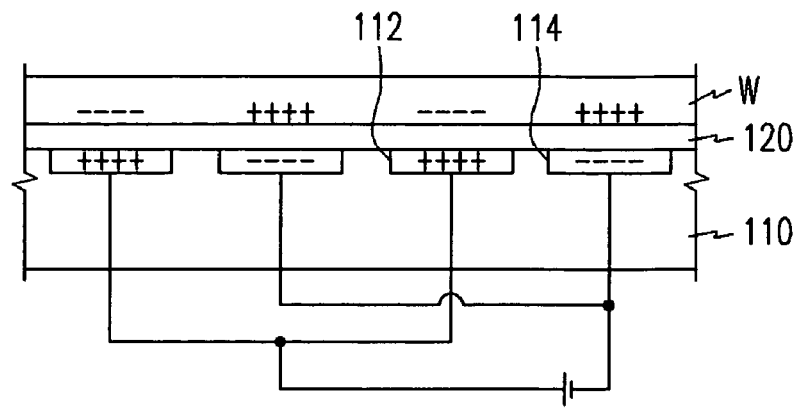
FIG. 1 is a schematic view illustrating a conventional electrostatic chuck.
Figure 2:
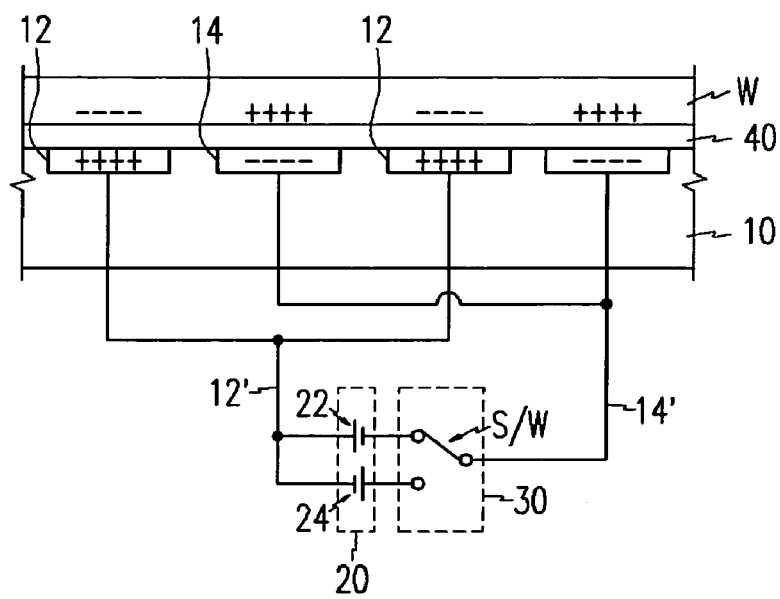
FIG. 2 is a schematic view illustrating an electrostatic chuck according to a preferred embodiment of the present invention.
Figure 3:
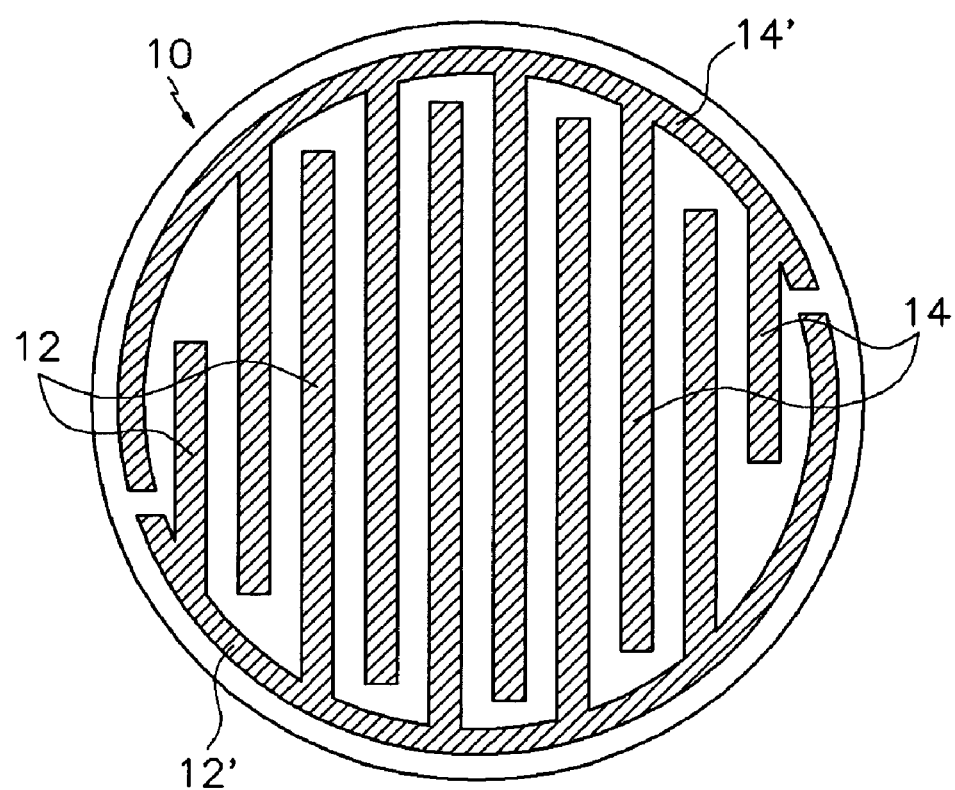
FIG. 3 is a top plan view of an electrode part of FIG. 2.

FIG. 2 and FIG. 3 are respectively a schematic view illustrating an electrostatic chuck and a top plan view of an electrode part of FIG. 2 according to a preferred embodiment of the present invention.

As shown in drawings, the electrostatic chuck according to the preferred embodiment of the present invention includes an electrode part 10, an electric source part 20, and a polarity inversion part 30.

The electrode part 10, which generates electric charge for fixing the wafer, includes first electrodes 12 and second electrodes 14 having different polarities. The first and second electrodes 12 and 14 are alternately arranged, and the electrodes having the same polarity are electrically conducted to by respective electric conductive parts 12 and 14'.

Here, the first electric conductive part 12 for conducting to the first electrodes 12 is serially connected to a positive electrode terminal of a first electric source 22, and a negative electrode terminal of the first electric source 22 is serially connected to a contact point "a". Also, the first electric conductive part 12 is serially connected to a negative electrode terminal of a second electric source 24, and a positive electrode terminal of the second electric source 24 is serially connected to a contact point "b".

The second electric conductive part 14' which conducts the second electrodes 14 is serially connected to a switch S/W, which is periodically alternately switched to be coupled with the contacts "a" and "b" under control of a control means (not shown), i.e., every time processing of a single wafer (W) is completed.

On the surface of the electrode part 10, a dielectric layer 40 comprising an oxide, or SiOF is formed, and a lift (not shown) can be installed so as to move the wafer (W) up and down.

A method for chucking the wafer using the above structured electrostatic chuck will be described hereinafter.

In case of loading and fixing the first wafer with the electrostatic chuck in a HDP CVD chamber for forming a protection layer or a dielectric layer such as an oxide layer or an SiOF layer on the wafer (W), the switch (S/W) of the polarity inversion part 30 is connected to the contact point "a". Accordingly, as shown in FIG. 2, the positive electricity is supplied from the first electric source 22 to the first electrodes 12, and the negative electricity is supplied from the first electric source 22 to the second electrodes 14.

Sequentially, when a second wafer is loaded to be processed after the first wafer is completely processed, the switch (S/W) is coupled to the contact point "b" under control of the control means (not shown) such that the negative electricity is supplied from the second electric source 24 to the first electrodes 12 and the positive electricity is supplied from the second electric source 24 to the second electrodes 14.

Also, when the second wafer is completed and a third wafer is loaded to be processed, the switch (S/W) is switched to be coupled with the contact point "a"

In this manner, every time the wafer is loaded to be processed, the polarities of the first and second electrodes 12 and 14 are changed a course, the cycle of the polarity inversion can be set such that the polarity is inverted every 2 or 3 wafers.

As described above, in the present invention the polarities of the first and second electrodes are periodically changed to maintain abrasion uniformity of the dielectric layer of the electrostatic chuck such that it is possible to prolong the life of the electrostatic chuck.

Also, due to the regular abrasion, it is possible to form the dielectric layer or the protection layer at a regular thickness and stabilize the plasma discharge.

What is claimed is:

1. An electrostatic chuck of semiconductor fabrication equipment, comprising:
    an electrode part including electrodes having different polarities and generating electrostatic charge for fixing a wafer;
    a dielectric layer comprising SiOF on an upper surface of the electrode part;
    an electric source part for supplying electricity to the electrode part; and
    a polarity inversion part for inverting the polarities of the electrode part in a predetermined cycle.

2. The electrostatic chuck of claim 1, wherein the electrode part comprises first and second electrodes that are alternately arranged, and first and second conductive parts for conducting to the first and second electrodes, respectively.

3. The electrostatic chuck of claim 2, wherein the electric source part comprises a first electric source for supplying positive and negative electricity to the respective first and second electrodes, and a second electric source for supplying the negative and positive electricity to the respective first and second electrodes.

4. The electrostatic chuck of claim 3, wherein the polarity inversion part comprises a switching circuit that periodically switches between the first and second electric sources.

5. The electrostatic chuck of claim 4, wherein the first electric source comprises a positive electrode terminal and a negative electrode terminal.

6. The electrostatic chuck of claim 5, wherein the second electric source comprises a negative electrode terminal and positive electrode terminal.

7. The electrostatic chuck of claim 6, wherein the polarity inversion part comprises a first contact point and a second contact point.

8. The electrostatic chuck of claim 7, wherein the first conductive part is serially connected to the positive electrode terminal of the first electric source, and a negative electrode terminal of the first electric source is serially connected to a first contact point.

9. The electrostatic chuck of claim 8, wherein the first conductive part is serially connected to the negative terminal of the second electric source, and the positive electrode terminal of the second electric source is serially connected to the second contact point.

10. The electrostatic chuck of claim 9, wherein the second conductive part is connected to the switching circuit, wherein the switching circuit can be alternately coupled with the first contact point and the second contact point.

11. The electrostatic chuck of claim 2, wherein the first and second electrodes each comprise multiple parallel conductive extensions arranged in a comb-like shape.

12. The electrostatic chuck of claim 11, wherein the parallel conductive extensions of the first and second electrodes are arranged in an alternating, interdigitating pattern.

13. The electrostatic chuck of claim 12, wherein the first and second electrodes are electrically isolated from each other.

14. The electrostatic chuck of claim 1, further comprising a lift for moving a wafer up and down.

15. The electrostatic chuck of claim 1, wherein a chucked wafer contacts the dielectric layer.

16. A method for chucking wafers using an electrostatic chuck of semiconductor fabrication equipment having first and second electrodes having opposite polarities, comprising contacting a single wafer with a dielectric layer on an upper surface of the electrostatic chuck, the dielectric layer comprising SiOF; forming an oxide layer or a SiOF layer on the single wafer; and
    inverting the polarities of the first and second electrodes each time the oxide layer or SiOF layer is formed on the single wafer.

17. The method as described in claim 16, wherein forming the oxide layer or SiOF layer on the single wafer comprises HDP chemical vapor deposition.

* * * * *